(12) United States Patent
Kamran et al.

(10) Patent No.: US 11,581,876 B1
(45) Date of Patent: Feb. 14, 2023

(54) FEEDBACK OSCILLATOR WITH MULTIPLE SWITCHED CAPACITORS

(71) Applicant: NXP B.V., Eindhoven (NL)

(72) Inventors: Muhammad Kamran, Helmond (NL); Dave Sebastiaan Kroekenstoel, Eindhoven (NL); Harry Neuteboom, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/557,943

(22) Filed: Dec. 21, 2021

(51) Int. Cl.
*H03K 3/011* (2006.01)
*H03B 5/12* (2006.01)
*H03K 3/03* (2006.01)

(52) U.S. Cl.
CPC .......... *H03K 3/011* (2013.01); *H03B 5/1265* (2013.01); *H03K 3/0315* (2013.01)

(58) Field of Classification Search
CPC ..... H03B 5/1265; H03K 3/0315; H03K 3/011
USPC ................................. 331/111, 143
See application file for complete search history.

(56) References Cited

U.S. PATENT DOCUMENTS 8,994,459 B2   3/2015   Patasani et al.
10,461,724 B2 * 10/2019  Hurwitz .................. H03B 1/00

OTHER PUBLICATIONS

Myungjoon Choi, et al., "A 99nW 70.4kHz Resistive Frequency Locking On-Chip Oscillator with 27.4ppm/° C. Temperature Stability," 2015 Symposium on VLSI Circuits Digest of Technical Papers; 2 pages.
Peiyu Chen, et al., "A 0.84pJ/cycle Wheatstone Bridge Based CMOS RC Oscillator with Reconfigurable Frequencies," 2019; 4 pages.

* cited by examiner

*Primary Examiner* — Arnold M Kinkead (57) ABSTRACT

A signal generator includes a first voltage generator, a second voltage generator, an operational amplifier, and an oscillator. The first voltage generator generates a first voltage, and the second voltage generator generates a second voltage. The operational amplifier generates an amplified error signal based on the first voltage and the second voltage, and the oscillator generates a periodic signal based on the amplified error signal. The first voltage generator and the second voltage generator are configured to generate their respective voltages based on the periodic signal. As a result, frequency deviation in the periodic signal may be corrected, for example, without increasing the source current of the oscillator or the gain of the operational amplifier. Also, improved phase noise performance may also be achieved through an increase in loop gain.

18 Claims, 7 Drawing Sheets

FEEDBACK OSCILLATOR WITH MULTIPLE SWITCHED CAPACITORS

Example embodiments disclosed herein relate to generating signals using oscillator circuits.

BACKGROUND

Signal generators are used in a wide variety of applications including smartphones, notebook computers, tablets, gaming devices, and other types of electronic devices and systems. Some signal generators use oscillators to form periodic signals for their intended applications. Examples of periodic signals include clock signals for controlling semiconductor devices and carrier waves for transmitting voice and data in communication systems.

One type of oscillator (known as a feedback oscillator) generates periodic signals using a feedback control loop. The control loop processes the oscillator output signal in a predetermined way and inputs an error signal into an operational amplifier which generates an amplified error signal. The error signal is then used to correct deviations in the oscillator signal to exhibit a stable frequency.

However, signal generators which use feedback oscillators have drawbacks. For example, for reducing phase noise, and susceptibility to systematic errors, you want to increase loop gain. However increasing the loop gain of the feedback oscillator produces a proportional increase in current, which, in turn, increases power consumption. Some oscillators add components in an attempt to compensate for these effects, but these components add cost and complexity and increase the overall size of the signal generator, which may be undesirable in many cases.

SUMMARY

In accordance with one or more embodiments, a signal generator generator includes a first voltage generator configured to generate a first voltage; a second voltage generator configured to generate a second voltage; an operational amplifier configured to generate an amplified error signal based on the first voltage and the second voltage; and an oscillator configured to generate a periodic signal based on the amplified error signal, wherein the first voltage generator is configured to generate the first voltage based on the periodic signal and the second voltage generator is configured to generate the second voltage based on the periodic signal.

The first voltage may vary based on a frequency deviation in the periodic signal; the second voltage may vary based on the frequency deviation in the periodic signal; and the first voltage and the second voltage may vary in opposing directions. The first voltage may be a first feedback voltage into the operational amplifier; and the second voltage may be a second feedback voltage into the operational amplifier. The first voltage generator may include a first voltage divider; and the second voltage generator may include a second voltage divider.

The first voltage divider may include a first resistor and a second resistor; the second voltage divider may include a third resistor and a fourth resistor; the first resistor may include a first switched-capacitor circuit with variable resistance; and the third resistor may include a second switched-capacitor circuit with variable resistance. The first switched-capacitor circuit has a first resistance when a periodic signal is in a steady state and a second resistance when the periodic signal is not in steady state; the second switched-capacitor circuit has a third resistance when the periodic signal is in steady state and a fourth resistance when the periodic signal is not in steady state; and each of the first resistance and the third resistance changing with changes in a frequency of the periodic signal.

The second switched-capacitor circuit may include a capacitor coupled to a node, the node coupled to the fourth resistor and a reference voltage input of the operational amplifier; a first switch configured to selectively couple the capacitor in a configuration that produces the third resistance; and a second switch configured to selectively couple the capacitor in a configuration that produces the fourth resistance, wherein the first switch and the second switch are configured to be activated at different times based on whether the periodic signal is in the first state or the second state. The first resistance may be different from the third resistance; and the second resistance may be different from the fourth resistance.

The steady state may include when the periodic signal has a predetermined frequency; and the non-steady state may include when the periodic signal has a frequency which deviates from the predetermined frequency. The oscillator may be configured to generate the periodic signal to have the predetermined frequency based on a source current for the oscillator, and the amplified error signal may correct the periodic signal from the frequency deviated from the predetermined frequency to the predetermined frequency without changing the source current for the oscillator. The amplified error signal may correct the periodic signal from the frequency deviated from the predetermined frequency to the predetermined frequency without changing a gain of the operational amplifier. A difference between the first and second voltages into the operational amplifier in the second state may be greater than a difference between the first and second voltages into the operational amplifier in the first state.

In accordance with one or more embodiments, a circuit includes a controller configured to generate a first and second variable voltages; and an error signal generator configured to generate an amplified error signal based on the first and second variable voltages, wherein the amplified error signal is configured to correct a frequency deviation in a periodic signal.

The controller may include a first switched-capacitor circuit which has a first resistance when a periodic signal has a first frequency and a second resistance when the periodic signal has a second frequency, and a second switched-capacitor which has a third resistance when the periodic signal has the first frequency and a fourth resistance when the periodic signal has the second frequency, and wherein the controller is configured to generate the first variable voltage to have a first value based on the first resistance and a second value based on the second resistance and to generate the second variable voltage to have a third value based on the third resistance and a fourth value based on the fourth resistance, each of the first resistance and the third resistance changing with changes in frequency of the periodic signal.

The first switched-capacitor circuit may have the first resistance or the second resistance based on a state of a feedback oscillator signal; and the second switched-capacitor may have the third resistance or the fourth resistance based on the state of the feedback oscillator signal, the feedback oscillator signal indicating whether the periodic signal has the first frequency or the second frequency. The first frequency may be a predetermined frequency; and the second frequency may correspond to a deviation from the predetermined frequency.

The controller may include a first voltage divider including a first resistor and a second resistor; a second voltage divider including a third resistor and a fourth resistor, and wherein the first resistor is based on the first switched-capacitor circuit and the third resistor is based on the second switched capacitor circuit. The second switched-capacitor circuit may include a capacitor coupled to a node, the node coupled to the fourth resistor and a reference voltage input of the signal generator; a first switch configured to selectively couple the capacitor in a configuration that produces the third resistance; and a second switch configured to selectively couple the capacitor in a configuration that produces the fourth resistance, wherein the first switch and the second switch are configured to be activated at different times based on whether the periodic signal has the first frequency or the second frequency.

The first variable voltage may correspond to a second feedback signal of the signal generator, and the second variable voltage may correspond to a first feedback signal of the signal generator. The signal generator may include an operational amplifier configured to generate the error signal. The operational amplifier may be configured to generate the amplified error signal based on a difference between the first and second variable voltages.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Figure 1:
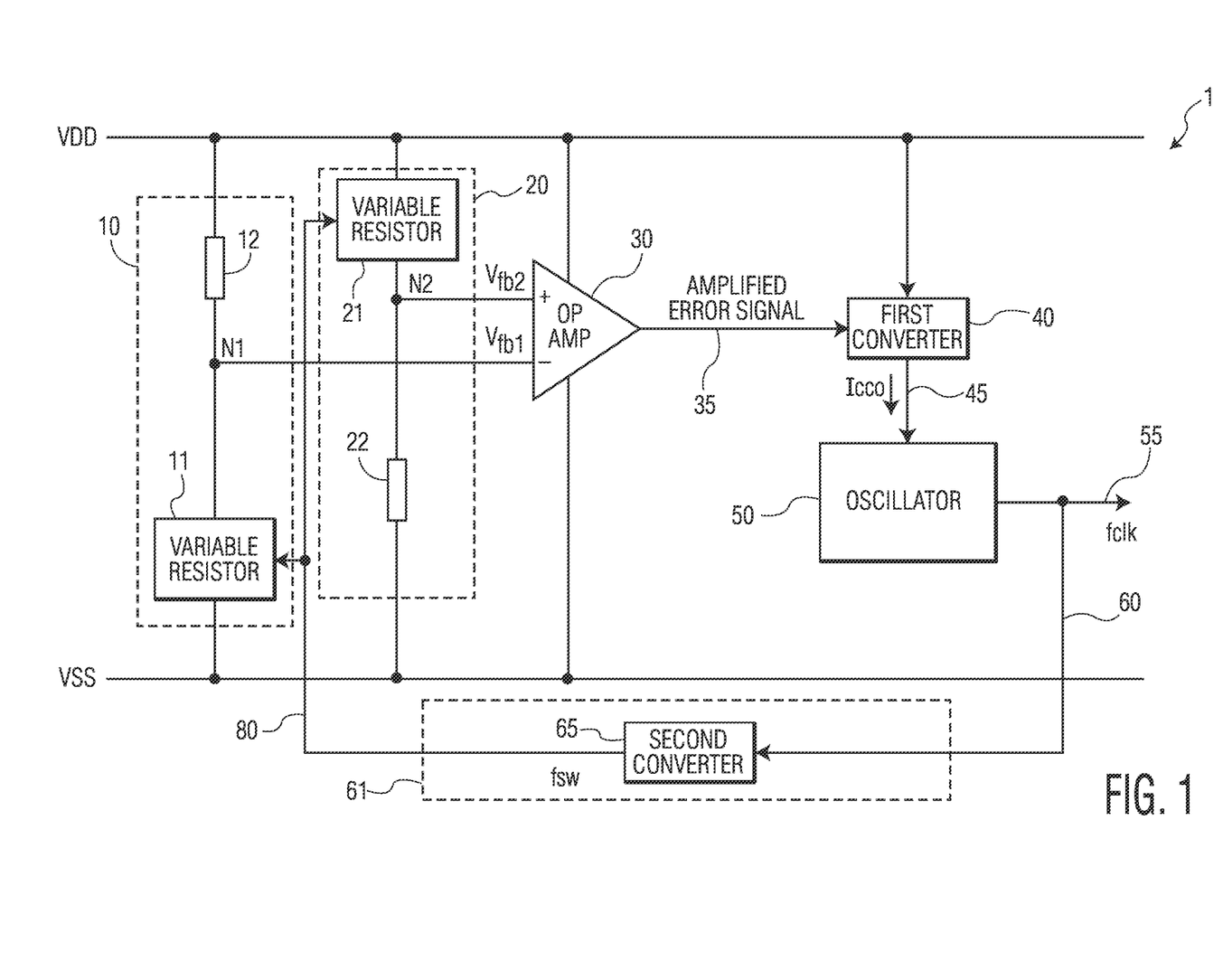
FIG. 1 illustrates an embodiment of a signal generator for generating a periodic signal.

FIG. 1 illustrates a signal generator 1 for generating a periodic signal for various applications. For example, the periodic signal may be a clock signal, carrier signal, or another type of periodic signal used to synchronize or otherwise control operations in another device or host system. Examples of the system or device include smartphones, notebook computers, tablets, gaming devices, interfaces, charging circuits, network servers, and/or various other types of devices and systems. For purposes of illustration, the periodic signal will be described as a clock signal in the discussion which follows.

Referring to FIG. 1, the signal generator includes a first voltage generator 10, a second voltage generator 20, an operational amplifier 30, a first converter 40, and an oscillator 50 situated between two voltage supply sources. The first voltage supply source $V_{DD}$ may supply a predetermined positive voltage, and the second voltage supply source $V_{SS}$ may be set to ground or another reference potential. The supply voltages may be determined, for example, based on the range of voltages set for the output clock signal. In one embodiment, the first and second voltage supply sources may provide voltages along corresponding supply rails of an integrated circuit chip or another type of semiconductor device or logic circuit.

The first voltage generator 10 generates a first voltage, which, for example, may correspond to what effectively corresponds to a first feedback voltage $V_{fb1}$. The first voltage generator may be a first voltage divider circuit, which includes a first resistor 11 and a second resistor 12 coupled to one another at a node N1. The first resistor 11 may be a variable resistor and the second resistor 12 may have a fixed resistance value. When the resistance of the variable resistor changes, the voltage at node N1 changes based on the ratio of the resistance of the variable resistor 11 at that time and the fixed resistance of resistor 12. Thus, the first feedback voltage $V_{fb1}$ may be considered to be a variable voltage determined in correspondence with changes in the resistance of resistor 11. The value of the fixed resistance of resistor 12 and the range of values in which the resistance of resistor 11 may be predetermined, for example, based on the clock signal frequency to be output from the signal generator and its attendant application within a host system.

The second voltage generator 20 generates a second voltage that may serve as a second feedback voltage $V_{fb2}$. The second voltage generator may be a second voltage divider circuit, which includes a third resistor 21 and a fourth resistor 22 coupled to one another at a node N2. The third resistor 21 may be a variable resistor and the fourth resistor 22 may have a fixed resistance value. When the resistance of third resistor 21 changes, the voltage at node N2 changes based on the ratio of the resistance of the third resistor 21 at that time and the fixed resistance of resistor 22. Thus, the second feedback voltage $V_{fb2}$ may be considered to be a variable voltage determined in correspondence with changes in the resistance of third resistor 21. The value of the fixed resistance of the fourth resistor and the range of values in which the resistance of third resistor may vary may be predetermined, for example, based on the clock signal frequency to be output from the signal generator and its attendant application within a host system. The resistors 12 and 22 may have the same or different resistances, and the resistances of the resistors 11 and 21 may vary in the same range or different ranges, and/or may have the same values depending their states of operation as described herein.

The first and second voltage divider circuits are controlled based on the same control signal 80, which in one embodiment corresponds to a feedback signal derived from the oscillator and having frequency $f_{sw}$. Because both voltage divider circuits are controlled by the same control signal 80, their operation is synchronized relative to one another in order to generate an amplified error signal 35 that is used to control the output clock signal 55 to stably maintain a predetermined frequency $f_{clk}$. The degree to which control signal 80 may be considered to be a feedback signal having a frequency $f_{sw}$ will be explained in greater detail below.

The operational amplifier 30 includes a non-inverting input (+) and an inverting input (−). The non-inverting input is coupled to receive the second feedback voltage $V_{fb2}$ from the second voltage divider circuit 20. The inverting input is coupled to receive the first feedback voltage $V_{fb1}$ from the first voltage divider circuit 10. The operation amplifier 30 operates as a differential amplifier that generates amplified error signal 35 by amplifying the difference between the feedback voltages. The amplification may be according to a predetermined gain selected to set the bounds of the amplified error signal. Instead of an operational amplifier, the signal generator may be modified to include other types of comparator or difference circuits.

The first converter 40 converts the amplified error signal 35 to a control signal 45 for purposes of controlling the oscillator 50 to generate the output clock signal. This operation may be performed, for example, based on an input source current or voltage. When the amplified error signal has a zero value, the voltage inputs into the operational amplifier are the same, indicating that there is no deviation in the frequency of the clock signal 55 and thus no correction operation is performed on the oscillator. In that case, control signal 45 may correspond to the source current or voltage for controlling the oscillator 50, e.g., during steady state conditions. Conversely, when the amplified error signal has a non-zero value, the voltage inputs into the operational amplifier are different, indicating that the frequency of the output clock signal has deviated (e.g., by Δf) from its desired value $f_{clk}$. In this case (e.g., when there is a deviation from steady state), the first converter 40 converts the source current or voltage into a correction signal corresponding to control signal 45 in order to correct the frequency deviation.

In one embodiment, control signal 45 may be a current signal, in which case the oscillator 50 may be considered to be a current-controlled oscillator (CCO). Such a current signal may be generated, for example, by the first converter 40 converting source current to a second current signal $I_{CCO}$ (e.g., derived from voltage supply $V_{DD}$) corresponding to correction control signal 45 when there is a frequency deviation. In one embodiment, the first converter 40 include a transistor having a transconductance gm that controls the conversion to be performed. Based on the transconductance, the amplified error signal 35 controls the converter 40 to generate a greater current or a reduced current to adjust the frequency of the output clock signal $f_{clk}$. In this way, the conversion performed based on the amplified error signal may stabilize the clock signal frequency when deviations arise, for example, because of temperature, process variations, systemic and/or other effects.

In another embodiment, the first converter 40 may generate a voltage control signal for the oscillator, for example, by converting a source voltage to an output control voltage $V_{CCO}$ (derived from supply rail $V_{DD}$) for the oscillator based on the amplified error signal. In this case, the oscillator may be considered a voltage-controlled oscillator which controls the frequency of the output clock signal based on the control voltage.

The oscillator 50 generates the clock signal at a predetermined frequency $f_{clk}$, under steady state conditions, based on the input control signal 45 (e.g., $I_{CCO}$ or $V_{CCO}$). The oscillator may have various configurations. For example, in one embodiment the oscillator 50 may include an inverter circuit having a tree structure or a ring structure. In other embodiments, the oscillator may have a half- or full-bridge configuration. In still other embodiments, an oscillator with a different structure may be used provided the frequency of its output is determined based on the input control signal 45. An example of an oscillator with a tree-inverter structure implemented using complementary metal oxide semiconductor (CMOS) transistors is described in subsequent embodiments.

The signal generator 1 also includes a feedback loop 60 which operates to feed back the output clock signal 55 to the first voltage divider 10 and the second voltage divider 20. (While reference numeral 60 points to a branch of the loop, it may be used to label the entire loop). In one embodiment, the feedback loop 60 may include a processing section 61 with one or more signal processing circuits. For example, the processing section 61 may include a second converter 65 which converts the output clock signal 55 to control signal 80 in the form of a feedback signal having frequency $f_{sw}$. In one embodiment, the second converter 65 may include a frequency divider to perform the conversion for generating the control signal 80.

The control signal 80 generated by the processing section of the feedback loop 60 is input into the first voltage divider 10 and the second voltage divider 20 to control generation of the input voltages into the operational amplifier 30, namely $V_{fb2}$ and $V_{fb1}$. When the frequency of the clock signal 55 deviates from a predetermined value $f_{clk}$, the resistances of the variable resistors of respective ones of the voltage dividers may vary, in order to change (and thus create a difference between) the input voltages of the operational amplifier. This causes the operational amplifier to generate amplified error signal 35 for purposes of correcting the clock signal frequency deviation back to frequency $f_{clk}$.

Through this operation, and particularly based on use of the variable resistors in the voltage dividers, the effective loop gain of the signal generator may be increased without having to increase current or the gain of the operational amplifier. This, in turn, will improve the power consumption efficiency of the signal generator, while at the same time achieve a higher loop gain, both of which may improve overall performance of the feedback oscillator circuit. For example, using a variable resistor in both resistor divider branches may lower phase noise of $f_{clk}$ with a factor 2, by increasing the loop gain with a factor 2 with no additional cost in terms of power consumption. In addition, the noise transfer function of the signal generator may be substantially reduced, thus providing an additional measure of improved performance compared with other types of signal generators.

Figure 2:
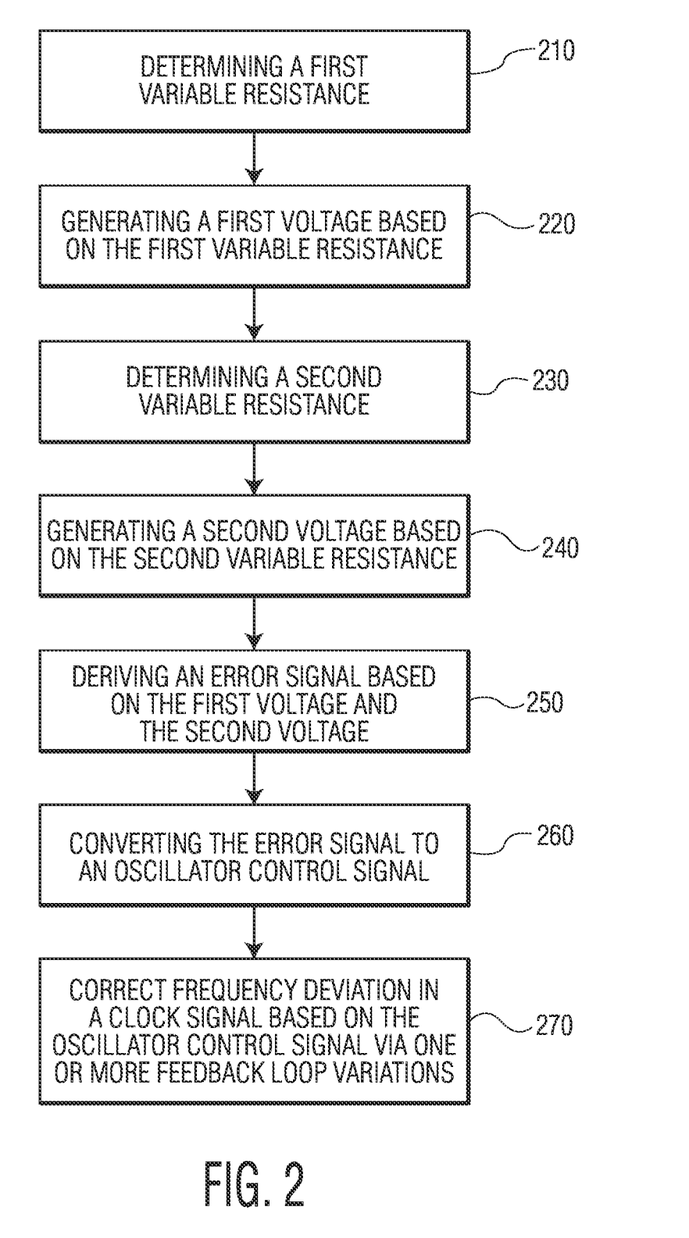
FIG. 2 illustrates an embodiment of a method for generating a periodic signal.

FIG. 2 illustrates operations included in an embodiment of a method for generating a periodic signal. The operations of the method may be performed, for example, by any of the embodiments of the signal generator described herein or may be performed by a different signal generator. For illustrative purposes, the method will be described in the case where signal generator 1 of FIG. 1 is used to perform the following operations.

Referring to FIG. 2, the method includes, at 210, determining a first variable resistance based on the clock signal 55 output from the oscillator 50. In one embodiment, the first variable resistance may correspond to the resistance of variable resistor 11 set based on the control signal 80 generated from output clock signal 55. When there is no frequency deviation in the clock signal, the first variable resistance may have a first value. When there is a frequency deviation in the clock signal, the first variable resistance may have a second value. As will be described, control signal 80 may be used to control switching of a capacitor in the variable resistor 11 in order to set the resistance values of the first variable resistance.

At 220, the value of the first variable resistance set by control signal 80 may be used as a basis for generating a first voltage, which, for example, may correspond to voltage $V_{fb1}$. As described herein, voltage $V_{fb1}$ may be generated by the first divider circuit 10 of which variable resistor 11 is included and coupled to fixed resistor 12. When the value of the first variable resistance is determined, voltage $V_{fb1}$ may be output from node N1 to the operational amplifier 30.

At 230, a second variable resistance is determined based on the clock signal 55 from the oscillator. In one embodiment, the second variable resistance may correspond to the resistance of variable resistor 21 set based on the control signal 80 generated from the output clock signal. When there is no frequency deviation in the clock signal, the second variable resistance may have a first value. When there is a frequency deviation in the clock signal, the first variable resistance may have a second value. The first and second values of the second variable resistance may be equal to or different from corresponding ones of the first and second values of the first variable resistance. As will be described, control signal 80 may be used to control switching of a capacitor in the variable resistor 21 in order to set the values of the second variable resistance.

At 240, the value of the second variable resistance may be used as a basis for generating a second voltage, which, for example, may correspond to the second feedback voltage $V_{fb2}$. As described herein, voltage $V_{fb2}$ may be generated by the second divider circuit 20 of which variable resistor 21 is included and coupled to fixed resistor 22. When the second variable resistance is determined, voltage $V_{fb2}$ may be output from node N2 to the operational amplifier 30.

At 250, an amplified error signal is derived based on the first voltage and the second voltage. In one embodiment, the amplified error signal is generated by the operational amplifier 30 comparing, or generating a difference between, voltage $V_{fb1}$ and voltage $V_{fb2}$ respectively output from the voltage dividers and then optionally amplifying that difference by a gain of the operational amplifier to generate amplified error signal 35. When there is no difference between the voltages, the amplified error signal may be zero, indicating that the clock signal of the oscillator is at the predetermined frequency $f_{clk}$.

At 260, the amplified error signal 35 is converted to a control signal 45. As previously explained, when there is no frequency deviation in the clock signal, control signal 45 (e.g., $I_{CCO}$) may correspond to the source current or source voltage. When there is a frequency deviation in the clock signal, the first converter 40 may modify the source current (or source voltage) to generate control signal 45 (e.g., $I_{CCO}$) as a correction signal to correct a frequency deviation in the clock signal, as previously explained.

At 270, the control signal 45 is input into an oscillator, which then corrects the output clock signal 55 back to frequency $f_{clk}$ over one or more iterations through the feedback loop.

Figure 3:
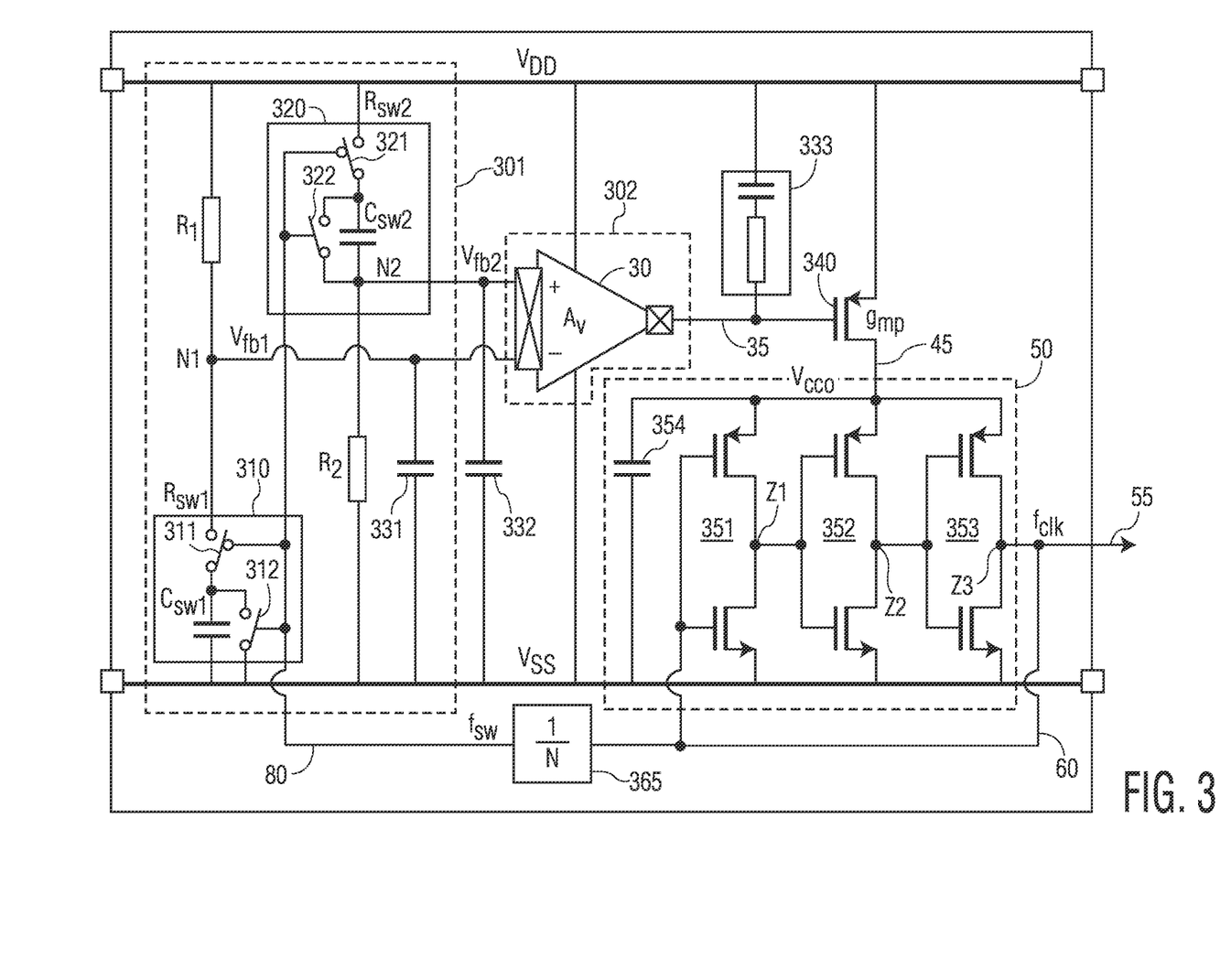
FIG. 3 illustrates an embodiment of a signal generator for generating a periodic signal.

FIG. 3 illustrates an embodiment of a signal generator 300 for generating a periodic signal. The signal generator 300 may be considered as one implementation of the signal generator 1 of FIG. 1, or may be considered apart from signal generator 1, for example, based on the differences between them. For illustrative purposes, signal generator 300 will be described with reference to FIG. 1 and the same reference numerals will be used for the same features.

Referring to FIG. 3, signal generator 300 includes the first voltage divider circuit 10 including and $R_{sw1}$, the second voltage divider circuit 20 including R2 and $R_{sw2}$, and the operational amplifier 30. In one embodiment, the first and second voltage dividers may be considered to be a controller circuit for controlling frequency deviations in the clock signal, and the operational amplifier may be considered to be an error signal generator.

The first voltage divider circuit 10 includes a first resistor $R_1$ (which may correspond to resistor 12) and a variable resistance $R_{SW1}$ which includes a first switched-capacitor circuit 310. The variable resistance $R_{SW1}$ may correspond to variable resistor 11 and its resistance may change with changes in the frequency of the clock signal $f_{clk}$ e.g., changes in resistance $R_{SW1}$ may be inversely proportional to changes in the frequency of the clock signal as explained below.

The first switched-capacitor circuit 310 includes a first switch 311, a second switch 312, and a first capacitor $C_{SW1}$. The first switch 311 selectively couples the first capacitor in a configuration which allows the variable resistor 11 to have a resistance value at steady state. This may be accomplished when there is no frequency deviation in the clock signal and by having the first switch 311 couple the first capacitor to node N1. The manner in which the first switched-capacitor circuit 310 operates to have variable resistance is explained as follows.

In operation, the first switched-capacitor circuit 310 can be seen as a resistance, where the resistance is inversely proportional to the switching frequency. By closing switch 311, the first capacitor $C_{sw1}$ to $V_{fb1}$, and in the next phase this charge is discharged to ground. On average, then, there is a certain charge Q that is transferred from node N1 corresponding to $V_{fb1}$ to ground in every period of the clock signal at 80. When looking at this behavior over a longer time, the first switched-capacitor circuit 310 may therefore be seen as having a resistance, e.s., a switched-capacitor resistance. Note that the current may be defined as I=dQ/dt, and knowing that $dQ=C_{sw1}*dV$, the resistance may be calculated as $R=V/I=dV/(dQ/dt)=dV/(C_{sw1}*dV/dt)=dt/C_{SW1}=1.0/(freq*C_{sw1})$.

The first switch 311 and the second switch 312 are alternatively switched by control signal 80, e.g., based on the value of this control signal. This may be accomplished, for example, by using transistors of different conductivity types for the switches. For example, the first switch may be implemented by a p-type metal oxide semiconductor (PMOS) transistor and the second switch may be implemented by an n-type MOS (NMOS). In other embodiments, the switches may be implemented using different logic or switching circuits.

Accordingly, the resistance of variable resistor $R_{SW1}$ is based on the relative configuration of the switches and the value of the control signal 80 received from the feedback loop. In this sense, the first switched-capacitor circuit may have a variable resistance that varies with the clock frequency.

In one embodiment, the resistance $R_{SW1}$ of the first switched-capacitor circuit 310 may be a function of the capacitance of the first capacitor $C_{SW1}$ and the feedback frequency $f_{sw}$ corresponding to control signal 80. When second converter 65 includes a frequency converter 365 that divides the frequency of the output clock signal 55 to generate $f_{sw}$, the resistance $R_{SW1}$ of the first switched-capacitor circuit may be mathematically expressed based on Equation 1

$$R_{SW1} = \frac{1}{\left(\frac{f_{clk}}{N}\right)c_{SW1}} \quad (1)$$

where $$fsw = \frac{f_{clk}}{N}$$

and N is the division ratio of the frequency divider 365 in the feedback loop.

From Equation 1, it can be seen that when the capacitance $C_{SW1}$ and N are fixed values, the resistance of the first switched-capacitor circuit is determined based on the clock signal 80. Accordingly, deviations in the frequency of the output clock signal will produce a corresponding change in the resistance of variable resistor 310 of the voltage divider circuit 10, which, in turn, will change the first feedback voltage $V_{fb1}$ at node N1 into the operational amplifier.

The second switched-capacitor circuit 320 includes a third switch 321, a fourth switch 322, and a second capacitor $C_{SW2}$. The third switch 321 selectively couples the second capacitor to the supply rail $V_{DD}$. The fourth switch 322 couples both sides of the second capacitor to the non-inverting input of the operational amplifier 30. The third switch 321 and the fourth switch 322 are alternatively switched by control signal 80, e.g., based on the value of this control signal. This may be accomplished, for example, by using transistors of different conductivity types to form the switches. For example, the third switch 321 may be implemented by a p-type metal oxide semiconductor (PMOS) transistor and the fourth switch 322 may be implemented by an n-type MOS (NMOS). In other embodiments, the switches may be implemented using different logic or circuits.

In one embodiment, the resistance $R_{SW2}$ of the second switched-capacitor circuit 320 may be a function of the capacitance of the second capacitor $C_{SW2}$ and the value of control signal 80 at frequency $f_{sw}$. When second converter 65 includes frequency converter 365 that divides the clock signal frequency to generate $f_{sw}$, the resistance of $R_{SW2}$ of the second switched-capacitor circuit may be mathematically expressed by Equation 2:

$$R_{SW2} = \frac{1}{\left(\frac{f_{clk}}{N}\right)c_{SW2}} \quad (2)$$

where $$fsw = \frac{f_{clk}}{N}$$

and N is the division ratio of the frequency divider 365 in the feedback loop.

From Equation 2, it can be seen that when the capacitance $C_{SW2}$ and N are fixed values, the resistance of the second switched-capacitor circuit 321 is determined based on the frequency of the clock signal. Accordingly, deviations in the frequency of the output clock signal will produce a corresponding change in resistance 320 of the voltage divider circuit 20, which, in turn, will change the second feedback voltage $V_{fb2}$ into the operational amplifier.

From Equations 1 and 2, it is evident that each of the first switched-capacitor circuit 310 and second switched-capacitor circuit 320 operate in one of two states, which are determined based on whether or not there is a deviation in the frequency of the output clock signal 55.

Steady State Resistance. When the frequency of the clock signal does not deviate from a predetermined frequency or range, each of the first and second switched-capacitor circuits have respective first resistances. The first resistances may be the same or different depending, for example, on whether or not capacitors $C_{SW1}$ and $C_{SW2}$ and/or other features of the switched-capacitor circuits are the same or different.

Non-Steady State Resistance. When the frequency of the clock signal deviates from a desired frequency or range (e.g., because of temperature, process, systemic, or other influences), each of the first and second switched-capacitor circuits have respective resistances that vary with clock frequency deviations. That is, the second resistances change with changes in frequency of the clock signal as the clock signal is corrected back to a state where the voltage inputs into the operational amplifier become equal. This may take one or more iterations through the feedback loop.

The resistances of the variable resistors 310 and 320 control the voltages input into the operational amplifier, and thus whether a frequency correction function is to be performed. In the first state, the first resistances of the switched-capacitor circuits 310 and 320 cause $V_{fb2}=V_{fb2}$. As a result, the operational amplifier 30 does not generate an error signal indicating that there is no deviation to be corrected in the frequency of the clock signal, e.g., the clock signal frequency is $f_{clk}$. This may be considered to be steady state operation.

In a non-steady state case, the second resistances of the switched-capacitor circuits 310 and 320 cause $V_{fb1} \neq V_{fb2}$. The amount of change in the feedback voltage depends on the change in resistance (e.g., change in resistance of $R_{SW1}$), which is based on the size of the frequency deviation of the clock signal frequency indicated by control signal 80. Also, in the second state, the connection state of the second capacitor $C_{SW2}$ changes the resistance $R_{SW2}$ of variable resistor 320, which, in turn, changes the second feedback voltage $V_{fb2}$. The amount of change in the reference voltage depends on the change in resistance (e.g., the second resistance value for $R_{SW2}$), which is also determined based on the size of the frequency deviation of the clock signal indicated by switching frequency $f_{sw}$.

Because the first feedback voltage $V_{fb1}$ and the second feedback voltage $V_{fb2}$ both change when a frequency deviation occurs in the clock signal, a greater voltage difference occurs between these voltages than if $V_{fb2}$ were set to a fixed value. This greater voltage difference translates into a comparatively larger amplified error signal 35 than if $V_{fb2}$ were fixed, and the larger amplified error signal performs oscillator frequency correction at a more rapid rate. Also, it increases the loop gain of the signal generator without having to increase current or amplifier gain.

More specifically, if it were not for varying both voltages input into the operational amplifier, the only way such a large amplified error signal could be generated is by increasing the gain of the amplifier or the overall loop gain and/or the use of a greater current $I_{CC0}$ (or greater voltage $V_{CC0}$). However, taking these measures would increase power consumption of the signal generator. Moreover, use of the switched-capacitor circuits allow the signal generator to be smaller in size and scale compared with a signal generator which uses fixed resistors for their voltage dividers. The correction operation terminates when steady state (e.g., $V_{fb1}=V_{fb2}$) is once again achieved.

The first converter 40 may include a PMOS transistor 340 having a transconductance gm that generates oscillator control signal 45 in the manner previously described.

The oscillator 50 has a tree-inverter or ring-oscillator configuration in this embodiment, including a first inverter 351, a second inverter 352, and a third inverter 353 which generate the clock signal 55. This tree-inverter also includes a capacitor 354. In operation, the three inverters respectively charge nodes z1, z2, and z3. The delay in each inverter is caused by charging the capacitance at each node. Since the output of inverter 353 is connected to the input of inverter 351, a repeating process is used to generate clock signal $f_{clk}$. The capacitor 354 over the ring oscillator is there to create a stable voltage $V_{CCO}$.

In addition to these features, the signal generator 300 may include a capacitor 331 and a capacitor 332. These capacitors may serve to filter ripple that comes from the switched-capacitor resistor circuits. Also, an RC circuit 333 may be coupled to the output of the operational amplifier 30 in order to make the feedback loop stable. The capacitor in combination with the impedance at node 35 creates a pole in the loop gain transfer function, and this should be the dominant pole. Optional you can add a series resistor to create a non-dominant zero in the loop gain transfer function to compensate other non-dominant poles. This will increase stability of the feedback loop.

Figure 4:
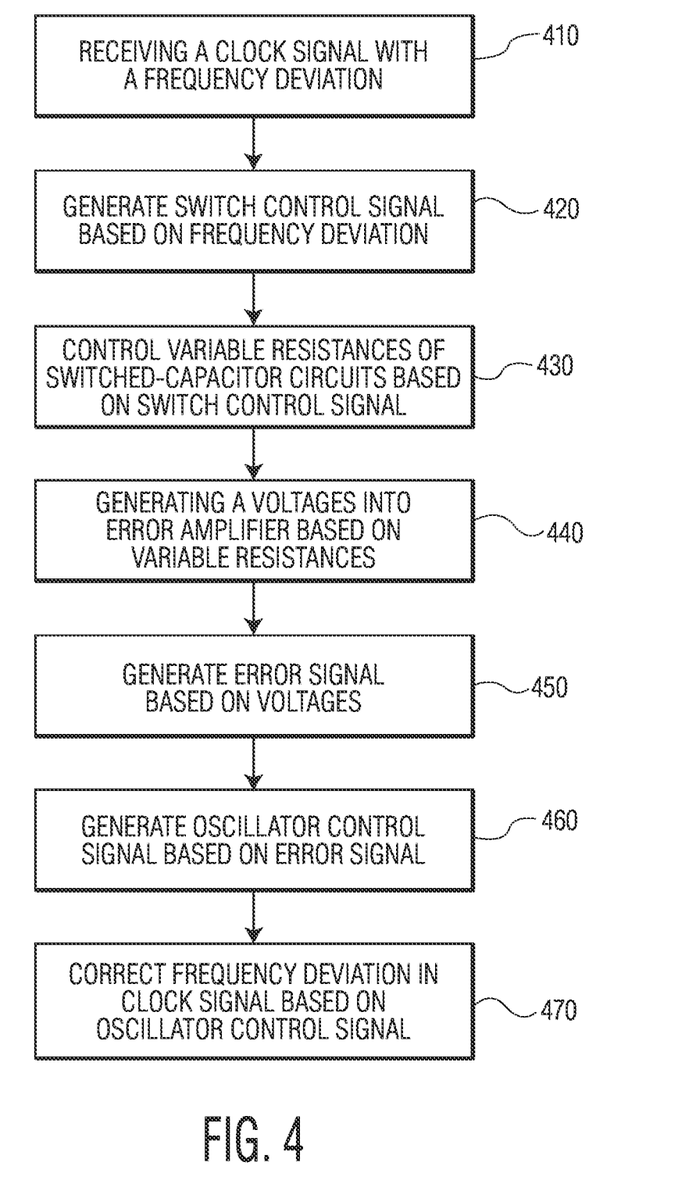
FIG. 4 illustrates an embodiment of a method for generating a periodic signal.

FIG. 4 illustrates an embodiment of a method for generating a periodic signal which may be performed, for example, by the signal generator 300 of FIG. 3. The method includes, at 410, receiving a clock signal 55 which deviates from a desired frequency $f_{clk}$ by an amount $\Delta f_{clk}$. The clock signal may be received, for example, by the feedback loop 61.

At 420, the clock signal 55 is converted to a feedback signal which effectively operates as a switch control signal. This operation may be performed by second converter 365. The feedback signal may correspond to control signal 80 with switching frequency $f_{sw}$ generated, for example, by dividing the clock signal frequency by a value, which, for example, may be a fixed integer value N≥1. The value of N may also be chosen to allow the capacitances $C_{SW1}$ and $C_{SW2}$ to be in a predetermined range. In one embodiment, the second converter 65 may include, for example, a Sigma-Delta modulator or other frequency divider which changes the division ratio of the clock frequency $f_{clk}$ to perform the intended switching operations in the switched-capacitor circuits.

At 430, the control signal 80 controls variable resistors $R_{SW1}$ and $R_{SW2}$ in the switched-capacitor circuits 310 and 320 to have resistance values based on the clock signal frequency deviation. For example, when there is a frequency deviation, control signal 80 controls the switches in each of the switched-capacitor circuits so that they assume the second state resistances previously discussed.

At 440, the first feedback voltage $V_{fb1}$ and the second feedback voltage $V_{fb2}$ are generated so that $V_{fb1} \ne V_{fb2}$, thereby reflecting that there is a frequency deviation in the clock signal. The difference between these voltages is proportional to the amount of the frequency deviation.

At 450, the operational amplifier 30 generates an amplified error signal 35 that corresponds to the size of the frequency deviation in the clock signal. Because both $V_{fb1}$ and $V_{fb2}$ change based on the frequency deviation, a relatively large amplified error signal is generated (compared to the case where $V_{fb2}$ is fixed). This relatively large amplified error signal is achieved without having to increase the oscillator current (or voltage) of the signal generator or the gain of the operational amplifier, thus allow the signal generator to achieve improved power efficiency.

At 460, an oscillator control signal 45 is generated based on the amplified error signal 35. This may be performed, for example, by the second converter 340 based on source current and the transconductance of a transistor included in that converter. The resulting control signal 45 is used as an oscillator control signal.

At 470, the frequency of the oscillator is corrected back to the desired clock frequency based on the control signal 45. This may be accomplished by one or more iterations through the feedback loop 61 until the steady state condition of $V_{fb1}=V_{fb2}$ is once again achieved, e.g., until $\Delta f_{clk}=0$.

Figure 5:
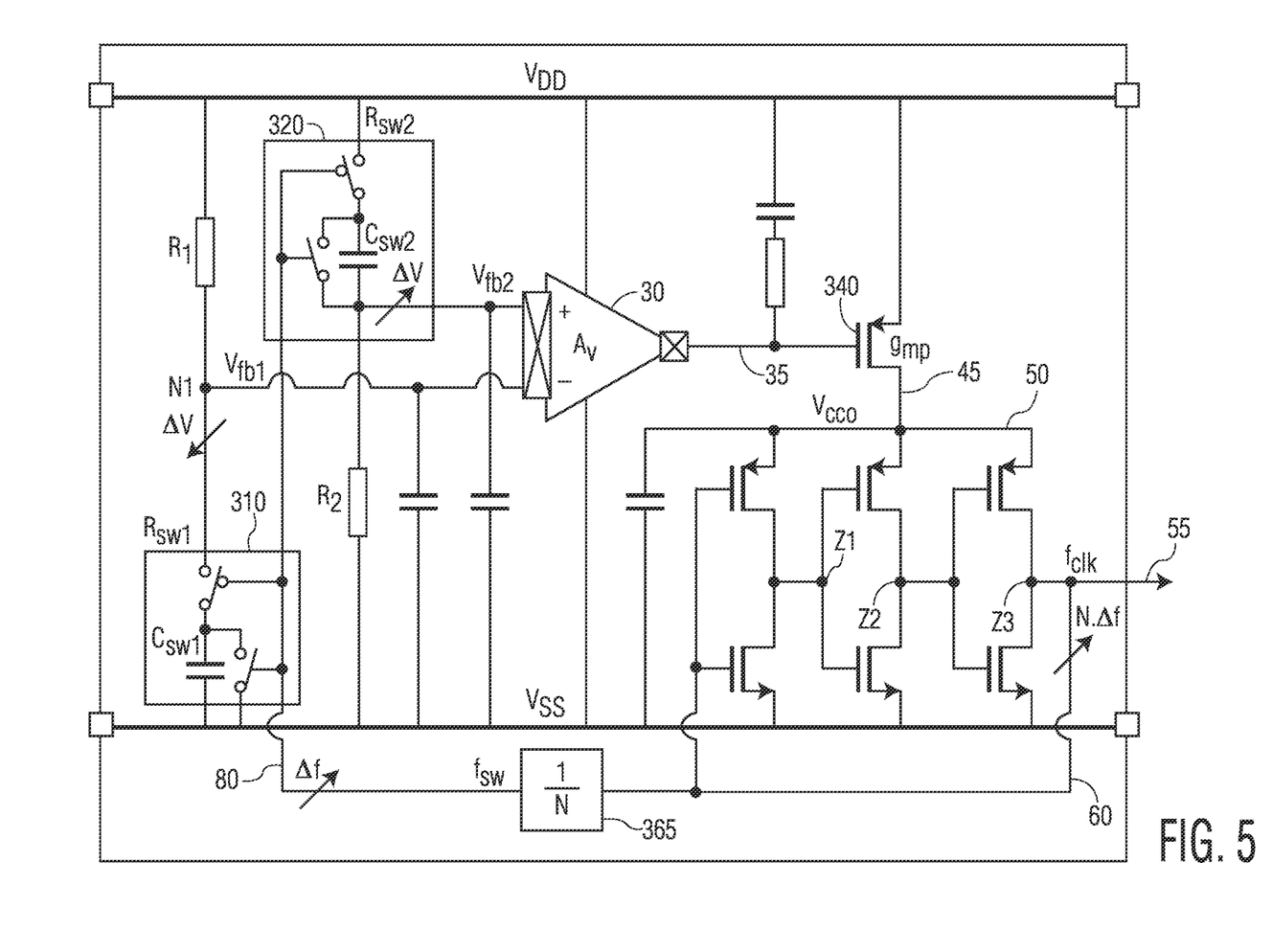
FIG. 5 illustrates an example of frequency deviation a signal generator.

Operation of the signal generator 300 of FIG. 3 may be mathematically explained as follows with reference to FIG. 5, which shows some of the parameters discussed below for clarity. In the signal generator of FIG. 3, at steady state $V_{fb1}=V_{fb2}$, the steady state frequency of the output clock signal is $f_{clk}$. Now, let us assume, that frequency $f_{clk}$ deviates by an amount $N\Delta f$. Then, the frequency deviation $\Delta f$ will produce in a voltage difference $\Delta V$ at node N1, because of the resistance change that has taken place in the switched-capacitor resistor $R_{SW1}$. The new voltage $V_{fb1}$ at node N1 may therefore be written Equations 3:

$$vfb1'=vfb1-\Delta V \qquad (3)$$

where of vfb1' is the changed voltage at node N1 generated based on output error frequency $N\Delta f$. A similar approach may be taken for vfb2':

$$vfb2'=vfb2+\Delta V \qquad (3)$$

At steady state, $V_{fb1}=V_{fb2}$. So, Equations 3 may be rewritten as Equations 4:

$$vfb1'=vfb2-\Delta V \qquad (4)$$

$$vfb2'=vfb1+\Delta V \qquad (4)$$

Assuming $R_1=R_2$ and $C_{sw1}=C_{sw2}$, the voltage difference $\Delta e$ that appears at the inputs of the operational amplifier 30 may be expressed based on Equation 5:

$$\Delta e = vfb1'-vfb2'=vfb1+\Delta V-vfb2+\Delta V=2\Delta V \qquad (5)$$

From Equation 5, it is evident that the difference between the voltages into the operational amplifier is $2\Delta V$, which increases the size of the amplified error signal 35 output from the operational amplifier by a proportional amount. For example, compared with other signal generator designs, the voltage difference $2\Delta V$ produces a larger amplified error signal 35 by at least a factor of 2, which, in turn, may increase the loop gain of the signal generator by, for example, 6 dB or more. The loop gain may be determined based on Equation 6:

$$LG = \frac{A_v \cdot g_{mp} \cdot K_{cco} \cdot K_{sw}'}{N} \quad (6)$$

where $A_p$ is the gain of the operational amplifier 30, $g_{mp}$ is the trans conductance of the PMOS transistor 340 in the first converter, and $K_{CCO}$ is the oscillator loop transfer function. In some cases, $K_{CCO}$ may be considered a constant value when the current-controlled oscillator core is optimized for rise and fall time for a specific frequency and $V_{DD}$ is fixed. The parameter $K_{sw}'$ may be given by Equations 7, 8, and 9:

$$K_{sw}' = \frac{dV_{fb2}}{df_{sw}} - \frac{dV_{fb1}}{df_{sw}} \quad (7)$$

$$\frac{dV_{fb1}}{df_{sw}} = \frac{d}{df_{sw}}\left[\frac{R_{sw1}}{R_1 + R_{sw1}} \cdot vdd\right] = \frac{-R_1 C_{sw}}{(1 + R_1 f_{sw} C_{sw})^2} \cdot vdd \quad (8)$$

$$\frac{dV_{fb2}}{df_{sw}} = \frac{d}{df_{sw}}\left[\frac{R_2}{R_2 + R_{sw2}} \cdot vdd\right] = \frac{R_2 C_{sw}}{(1 + R_2 f_{sw} C_{sw})^2} \cdot vdd \quad (9)$$

When $R_1=R_2=R$, $K_{sw}'$ may be expressed by Equation 10:

$$K_{sw}' = \frac{2 \cdot R \cdot C_{sw}}{(1 + Rf_{sw}C_{sw})^2} \cdot vdd \quad (10)$$

Also, when $R_1=R_2=R$, then at steady state $R=R_{sw}=1/(f_{sw}C_{sw})$. When this is the case, Equation 9 may be rewritten as Equation 11:

$$K_{sw}' = \frac{2 \cdot R \cdot C_{sw}}{4} \cdot vdd \quad (11)$$

Compared with other signal generator designs, $K'_{sw}$ is increased at a factor of 2 or more. This increases the loop gain without having to increase the gain of the operational amplifier or the oscillator control current or voltage. The loop gain may be expressed by Equation 12:

$$LG = \frac{2 \cdot A_v \cdot g_{mp} \cdot K_{cco}}{4 \cdot N \cdot f_{sw}} \cdot vdd \quad (12)$$

Figure 6:
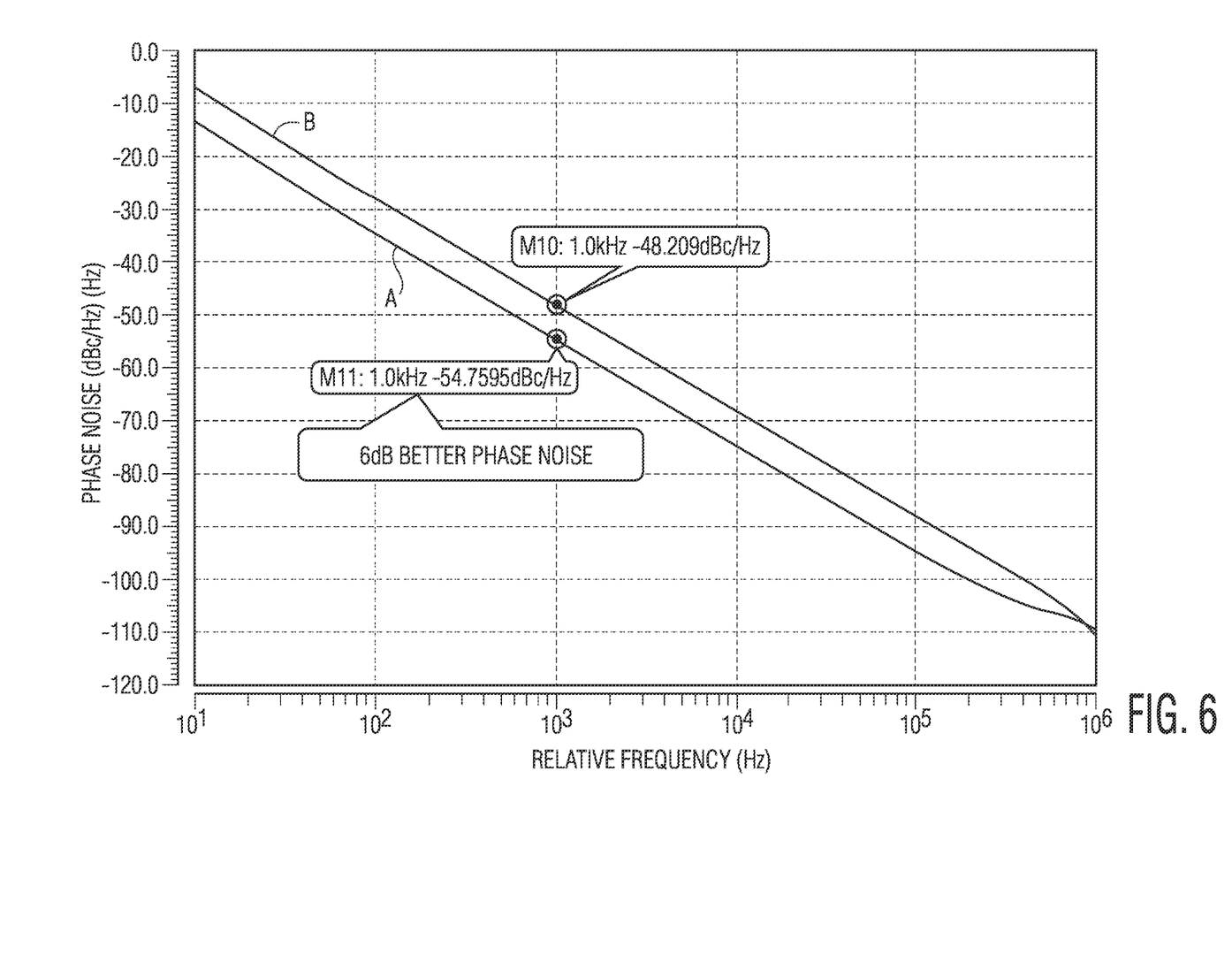
FIG. 6 illustrates an example of phase noise performance of one or more embodiments.

FIG. 6 shows an example of the phase noise performance one or more embodiments described herein may achieve. In FIG. 6, curve A corresponds to the phase noise of one or more embodiments of the signal generator and curve B shows the phase noise achieved by another type of signal generator. A comparison of curve A to curve B shows that the embodiment of signal generator described herein achieves at least 6 dB phase noise reduction. The noise transfer function of the signal generator configured in accordance with the embodiments described herein may be expressed by Equation 13:

$$X = \frac{4 \cdot f_{clk}}{2 \cdot N} \quad (13)$$

where $f_{osc}$ is the frequency of the oscillator. In Equation 12, X represents a transfer function from the input of the oscillator in the frequency domain. This equation shows that noise is reduced with a factor of 2 by use of both switched-capacitor resistor circuits 310 and 320, as opposed to the case where, for example, a switched-capacitor resistor circuit is used only for switched-capacitor resistor circuit 310 and a fixed resistor is used for $R_{SW2}$.

Figure 7:
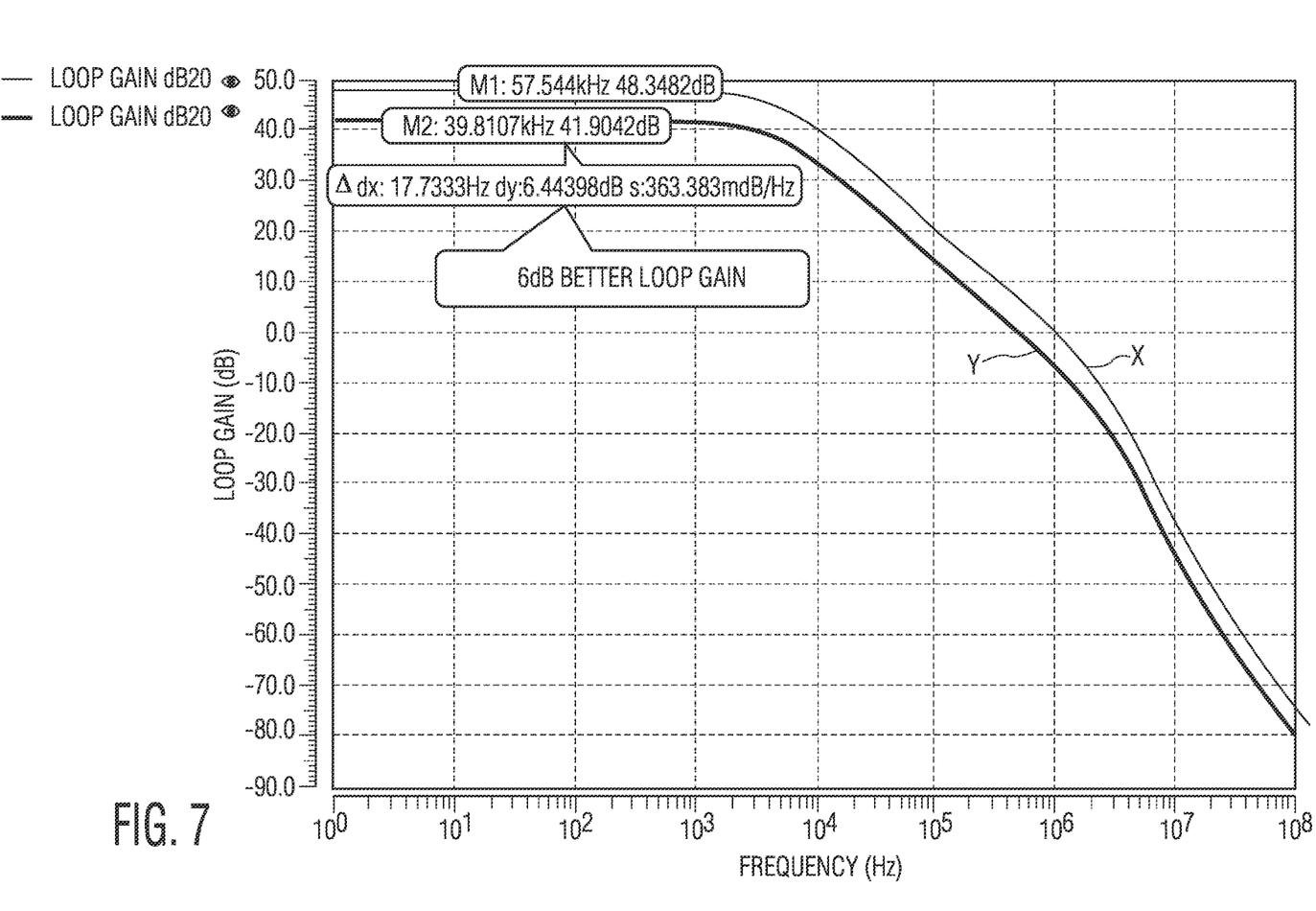
FIG. 7 illustrates an example of loop gain performance of one or more embodiments.

FIG. 7 shows an example of loop gain that may be achieved by a signal generator configured in accordance with one or more embodiments described herein. In FIG. 7, curve X shows the loop gain of an example embodiment of the signal generator and curve Y shows the loop gain performance of other types of signal generators which have been proposed. Based on a comparison of these curves, the example embodiment of the signal generator achieves a 6 dB loop gain increase, which corresponds to an improvement by at least a factor of two.

In accordance with one or more of the aforementioned embodiments, a signal generator includes a first voltage generator, a second voltage generator, an operational amplifier, and an oscillator. The first voltage generator generates a first voltage, and the second voltage generator generates a second voltage. The operational amplifier generates an amplified error signal based on the first voltage and the second voltage, and the oscillator generates a periodic signal based on the amplified error signal. The first voltage generator and the second voltage generator are configured to generate their respective voltages based on the periodic signal. As a result, frequency deviation in the periodic signal may be corrected, for example, without increasing the source current of the oscillator or the gain of the operational amplifier.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Although the various exemplary embodiments have been described in detail with particular reference to certain exemplary aspects thereof, it should be understood that the invention is capable of other example embodiments and its details are capable of modifications in various obvious respects. As is apparent to those skilled in the art, variations and modifications can be affected while remaining within the spirit and scope of the invention. The embodiments may be combined to form additional embodiments. Accordingly, the foregoing disclosure, description, and figures are for illustrative purposes only and do not in any way limit the invention, which is defined by the claims.

We claim:

1. A signal generator, comprising:
   a first voltage generator configured to generate a first voltage;
   a second voltage generator configured to generate a second voltage;
   an operational amplifier configured to generate an amplified error signal based on the first voltage and the second voltage; and
   an oscillator configured to generate a periodic signal based on the amplified error signal,
   wherein the first voltage generator is configured to generate the first voltage based on the periodic signal and the second voltage generator is configured to generate the second voltage based on the periodic signal;

wherein the first voltage generator includes a first voltage divider;

wherein the second voltage generator includes a second voltage divider;

wherein the first voltage divider includes a first resistor and a second resistor;

wherein the second voltage divider includes a third resistor and a fourth resistor;

wherein the first resistor includes a first switched-capacitor circuit with variable resistance; and wherein the third resistor includes a second switched-capacitor circuit with variable resistance.

2. The signal generator of claim 1, wherein:

the first voltage varies based on a frequency deviation in the periodic signal;

the second voltage varies based on the frequency deviation in the periodic signal; and the first voltage and the second voltage vary in opposing directions.

3. The signal generator of claim 1, wherein:

the first voltage is a first feedback voltage into the operational amplifier; and the second voltage is a second feedback voltage into the operational amplifier.

4. The signal generator of claim 1, wherein:

the first switched-capacitor circuit has a first resistance when a periodic signal is in a steady state and a second resistance when the periodic signal is not in steady state;

the second switched-capacitor circuit has a third resistance when the periodic signal is in steady state and a fourth resistance when the periodic signal is not in steady state; and each of the first resistance and the third resistance changing with changes in a frequency of the periodic signal.

5. The signal generator of claim 4, wherein the second switched-capacitor circuit includes:

a capacitor coupled to a node, the node coupled to the fourth resistor and a reference voltage input of the operational amplifier;

a first switch configured to selectively couple the capacitor in a configuration that produces the third resistance; and a second switch configured to selectively couple the capacitor in a configuration that produces the fourth resistance, wherein the first switch and the second switch are configured to be activated at different times based on whether the periodic signal is in the first state or the second state.

6. The signal generator of claim 4, wherein:

the first resistance is different from the third resistance; and the second resistance is different from the fourth resistance.

7. The signal generator of claim 4, wherein:

the steady state includes when the periodic signal has a predetermined frequency; and the non-steady state includes when the periodic signal has a frequency which deviates from the predetermined frequency.

8. The signal generator of claim 7, wherein:

the oscillator is configured to generate the periodic signal to have the predetermined frequency based on a source current for the oscillator, and the amplified error signal corrects the periodic signal from the frequency deviated from the predetermined frequency to the predetermined frequency without changing the source current for the oscillator.

9. The signal generator of claim 7, wherein the amplified error signal corrects the periodic signal from the frequency deviated from the predetermined frequency to the predetermined frequency without changing a gain of the operational amplifier.

10. The signal generator of claim 7, wherein a difference between the first and second voltages into the operational amplifier in the second state is greater than a difference between the first and second voltages into the operational amplifier in the first state.

11. A circuit, comprising:

a controller configured to generate a first and second variable voltages; and an error signal generator configured to generate an amplified error signal based on the first and second variable voltages, wherein the amplified error signal is configured to correct a frequency deviation in a periodic signal and wherein the controller includes:

a first switched-capacitor circuit which has a first resistance when a periodic signal has a first frequency and a second resistance when the periodic signal has a second frequency, and a second switched-capacitor which has a third resistance when the periodic signal has the first frequency and a fourth resistance when the periodic signal has the second frequency, and wherein the controller is configured to generate the first variable voltage to have a first value based on the first resistance and a second value based on the second resistance and to generate the second variable voltage to have a third value based on the third resistance and a fourth value based on the fourth resistance, each of the first resistance and the third resistance changing with changes in frequency of the periodic signal.

12. The circuit of claim 11, wherein:

the first switched-capacitor circuit has the first resistance or the second resistance based on a state of a feedback oscillator signal; and the second switched-capacitor has the third resistance or the fourth resistance based on the state of the feedback oscillator signal, the feedback oscillator signal indicating whether the periodic signal has the first frequency or the second frequency.

13. The circuit of claim 11, wherein:

the first frequency is a predetermined frequency; and the second frequency corresponds to a deviation from the predetermined frequency.

14. The circuit of claim 11, wherein the controller includes:

a first voltage divider including a first resistor and a second resistor;

a second voltage divider including a third resistor and a fourth resistor, and wherein the first resistor is based on the first switched-capacitor circuit and the third resistor is based on the second switched capacitor circuit.

15. The circuit of claim 14, wherein the second switched-capacitor circuit includes:

a capacitor coupled to a node, the node coupled to the fourth resistor and a reference voltage input of the signal generator;

a first switch configured to selectively couple the capacitor in a configuration that produces the third resistance; and a second switch configured to selectively couple the capacitor in a configuration that produces the fourth resistance, wherein the first switch and the second switch are configured to be activated at different times based on whether the periodic signal has the first frequency or the second frequency.

16. The circuit of claim 11, wherein:

the first variable voltage corresponds to a second feedback signal of the signal generator, and the second variable voltage corresponds to a first feedback signal of the signal generator.

17. The circuit of claim 14, wherein the signal generator includes an operational amplifier configured to generate the error signal.

18. The circuit of claim 15, wherein the operational amplifier is configured to generate the amplified error signal based on a difference between the first and second variable voltages.

* * * * *